(12) United States Patent
Teboulle et al.

(10) Patent No.: US 10,989,746 B2
(45) Date of Patent: Apr. 27, 2021

(54) METHOD FOR READING INFORMATION FROM A SET OF ELECTRICITY METERS

(71) Applicant: SAGEMCOM ENERGY & TELECOM SAS, Rueil Malmaison (FR)

(72) Inventors: Henri Teboulle, Rueil Malmaison (FR); Jérôme Barois, Rueil Malmaison (FR); Julien Barthes, Rueil Malmaison (FR); Ziv Roter, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 11 days.

(21) Appl. No.: 16/629,356

(22) PCT Filed: Jul. 11, 2018

(86) PCT No.: PCT/EP2018/068851
§ 371 (c)(1),
(2) Date: Jan. 8, 2020

(87) PCT Pub. No.: WO2019/016053
PCT Pub. Date: Jan. 24, 2019

(65) Prior Publication Data
US 2020/0209292 A1    Jul. 2, 2020

(30) Foreign Application Priority Data

Jul. 19, 2017   (FR) ........................................ 1756855
Dec. 6, 2017   (FR) ........................................ 1761725

(51) Int. Cl.
*G01R 22/06* (2006.01)
*H04Q 9/02* (2006.01)

(52) U.S. Cl.
CPC .............. *G01R 22/063* (2013.01); *H04Q 9/02* (2013.01); *H04Q 2209/30* (2013.01); *H04Q 2209/60* (2013.01)

(58) Field of Classification Search
CPC .... G01R 22/063; H04Q 9/02; H04Q 2209/60; H04Q 2209/30; H04Q 2209/756; H04Q 9/00
See application file for complete search history.

(56) References Cited

U.S. PATENT DOCUMENTS 9,706,268 B2 *   7/2017   Lee .......................... H04Q 9/00
10,068,048 B1 *   9/2018   Eslami Dehkordi ....................... G06F 30/398

(Continued)

FOREIGN PATENT DOCUMENTS

FR      2871981 A1     12/2005

OTHER PUBLICATIONS

Oct. 1, 2018 International Search Report issued in International Patent Application No. PCT/EP2018/068851.

(Continued)

*Primary Examiner* — John E Breene
*Assistant Examiner* — Eyob Hagos
(74) *Attorney, Agent, or Firm* — Oliff PLC; R. Brian Drozd

(57) ABSTRACT

Electric meters are connected by an electricity supply network to a data concentrator with which the meters communicate by powerline. A method for reading information from meters is based on a classification of the meters in a plurality of classes. A first class, read first, groups together meters that haven't been read in a last execution of the method. The other classes group together the meters according to a rate of response to requests for information coming from the concentrator. The classes grouping together the meters that have (Continued)

the lowest response rates are read last. In each class, each meter is classified according to information representing a topology of the network having an influence on the failure risk of the transmissions of information by the meter. The concentrator accounts for the classification of the meters when the meters in the network are read to reduce occurrences of periods of contention.

15 Claims, 3 Drawing Sheets

(56) References Cited

U.S. PATENT DOCUMENTS

| | | | | |
|---|---|---|---|---|
| 2006/0164257 A1* | 7/2006 | Giubbini | ........... | H04B 3/546 340/870.02 |
| 2013/0106616 A1* | 5/2013 | Gustafsson | ........... | H04Q 9/00 340/870.02 |
| 2013/0110837 A1* | 5/2013 | Dai | ........... | H04Q 9/00 707/737 |
| 2013/0201031 A1* | 8/2013 | Yang | ........... | H04Q 9/00 340/870.02 |
| 2014/0077970 A1* | 3/2014 | Yu | ........... | H04Q 9/00 340/870.03 |
| 2014/0176340 A1* | 6/2014 | Liang | ........... | H04W 12/02 340/870.02 |
| 2014/0340236 A1* | 11/2014 | Rhoads | ........... | G08C 19/12 340/870.02 |
| 2015/0296277 A1 | 10/2015 | Lee | | |
| 2017/0153124 A1* | 6/2017 | Li | ........... | H04Q 9/00 |
| 2017/0285715 A1* | 10/2017 | Tsuji | ........... | H04Q 9/00 |
| 2019/0098377 A1* | 3/2019 | Kallus | ........... | H04Q 9/00 |

OTHER PUBLICATIONS

Oct. 1, 2018 Written Opinion issued in International Patent Application No. PCT/EP2018/068851.

* cited by examiner

METHOD FOR READING INFORMATION FROM A SET OF ELECTRICITY METERS

The present invention relates to a method for reading information from a set of electricity meters connected by an electricity supply network to a data concentrator with which said electricity meters communicate by powerline and a device implementing the method.

Power Line Communications (PLC) are developing, in particular in the context of electricity supply networks of the AMM (Automated Meter Management) type. Communication networks are thus implemented on top of electricity supply networks for the automated collection, from smart electricity meters, of electricity consumption reading data. Powerline communications use for example PLC communication protocols such as the G3-PLC protocol (Third Generation PLC, ITU-T G.9903) or PRIME protocol (PoweRline Intelligent Metering Evolution).

One principle of PLC communications consists of superimposing, on an alternating electrical supply signal, referred to as a carrier signal or carrier, an information signal at a higher frequency and low energy representing data to be transmitted.

With this development of AMM-type power supply networks, which we call PLC networks hereinafter, new problems are posed. In particular PLC networks now comprise a large number of electricity meters for which a reading of information (for example load curves) must be carried out in a minimum amount of time. In the current operation of PLC networks, the readings of information from electricity meters take place without distinguishing the electricity meters. Since these networks use a method of access to the medium of the CSMA/CA type (Carrier-Sense Multiple Access with Collision Avoidance) at the MAC (Medium Access Control) level, the non-distinction of the electricity meters causes a great deal of contention time, which has the effect of slowing down the reading of the information from the meters. This is because, in networks of the CSMA/CA type, each sending device listens on the medium in order to determine whether this medium is free so that said sending device can transmit its own data. If the sending device detects that the medium is free, it transmits its data. If at the same moment another sending device sends data over the medium, the data collide. In this case, the two sending devices determine a random period at the end of which they re-listen on the medium and will make an attempt at transmission if the medium is free. This random period is referred to as contention time (or period). It is preferable to minimise the time spend by the sending devices in contention periods in order to avoid slowing down communications. It will easily be understood in fact that data communications that take place directly, without passing through contention periods, are quicker.

Methods of the TDM (time division multiplexing) type exist for avoiding electricity meters transmitting information at the same moment. However, methods of the TDM type have the drawback of requiring synchronising all the electricity meters with each other.

It is desirable to overcome these drawbacks of the prior art. It is in particular desirable to propose a method that makes it possible to read a maximum number of meters in a minimum amount of time. It is particularly desirable for this method to minimise the contention time on the network.

It is also desirable to provide a solution that is simple to implement at low cost.

According to a first aspect of the present invention, the present invention relates to a method for reading information from a set of electricity meters, referred to as meters, connected by an electricity supply network to a data concentrator, referred to as a concentrator, with which said meters communicate by powerline. The method is executed by said concentrator and comprises:

obtaining information representing a set of meters classified in a plurality of classes, a first class comprising meters for which no information has been collected during the execution of said method preceding a current execution, a second class comprising meters having a rate of response to requests for information transmitted by said concentrator greater than a predetermined reference rate, a third class comprising meters having a rate of response to the requests for information transmitted by said concentrator below or equal to said predetermined reference rate, during a predefined period fixing a time allocated to the concentrator for carrying out the reading of the meters in said set, running through each class one by one by increasing order of classes, passing from a class currently being read to a new class when there no longer remain any meters to be read in the class currently being read; and, in each class: defining a list of a predefined number of meters in the class, each meter in the list being associated with information representing a topology of the network in a zone comprising said meter having an influence on a risk of failure of the transmissions of information by said meter, referred to as risk information, said list satisfying a predetermined condition such that at least one of the meters in the list is associated with risk information below a predetermined threshold indicating that a transmission of information emanating from this meter has little chance of colliding with a simultaneous transmission emanating from another meter in the list; a request for information being transmitted to each meter following insertion thereof in said list; and, for each meter in the list, on reception of a response to a request for information concerning said meter or at the expiry of a predefined maximum response time concerning said meter, updating the list by replacing said meter in the list with another meter in the class so that the updated list satisfies the predetermined condition.

According to one embodiment, the risk information is a risk score and, when running through a class, each list is formed by extracting the meters from the class in decreasing order of the risk scores and so as to satisfy a predetermined condition on the list such that a risk metric below a predetermined threshold is associated with each possible pair of meters in the list, said metric being proportional to a risk that a transmission of information emanating from a meter in the pair collides with a simultaneous transmission of information emanating from the other meter in the pair.

According to one embodiment, the risk metric of a pair of meters is dependent on a number of common nodes between the two meters in the pair on a path used by each meter in the pair for communicating with the concentrator and a relative position of each common node in said path.

According to one embodiment, for each meter in the class, the risk score of said meter is a mean of the risk metric calculated for each pair of meters in which said meter is involved.

According to one embodiment, the predetermined threshold value is a mean of the risk scores.

According to one embodiment, at each updating of the list, the meter to which the response to the request for information or the expiry of a predetermined maximum response time relates is removed from the class and the risk scores are recalculated for the remaining meters in the class, taking into account the removal of said meter concerned from the class.

According to one embodiment, in each class, the meters are furthermore classified in at least two subclasses, a first subclass comprising meters associated with risk information below a first predetermined risk threshold and a second subclass comprising meters associated with risk information above a second predetermined risk threshold, the list comprising at least one meter in each subclass as long as each subclass comprises at least one meter to be read and in that, on updating, the list being updated by replacing a meter in the list with another meter in the same subclass as long as there remain meters to be read in said subclass.

According to one embodiment, the risk information associated with a meter, referred to as the first meter, comprises a value representing a density of meters in the vicinity of said first meter and/or a value representing a number of intermediate nodes between said first meter and said concentrator, each intermediate node being a meter relaying frames from the first meter to the concentrator.

According to one embodiment, the list comprises a number of meters for each subclass proportional to a number of meters in the class belonging to said subclass.

According to one embodiment, the first and second risk thresholds are defined so as to have the same number of meters in each subclass and the list comprises the same number of meters in each subclass.

According to one embodiment, the meters are ordered in each subclass by order of values representing a decreasing density of meters and/or by order of values representing a decreasing number of intermediate nodes, and, when the list or each updating of the list is defined, the meters in a subclass are taken in their order of appearance in said subclass.

According to a second aspect of the invention, the invention relates to a device for reading information from a set of electricity meters, referred to as meters, connected by an electricity supply network to a data concentrator, referred to as a concentrator, with which said meters communicate by powerline. The device comprises: obtaining means for obtaining information representing a set of meters classified in a plurality of classes, a first class comprising meters for which no information has been collected during an execution of said method preceding a current execution, a second class comprising meters having a response rate to requests for information transmitted by said concentrator greater than a predetermined reference rate, a third class comprising meters having a response rate to the requests for information transmitted by said concentrator below or equal to said predetermined reference rate, running-through means for running through, for a predefined period fixing a time allocated for making the reading of the meters in said set, each class one by one by increasing order of classes, passing from a class currently being read to a new class when there no longer remain any meters to be read in the class currently being read; and means executed for each class comprising: definition means for defining a list of a predefined number of meters in the class, each meter in the list being associated with information representing a topology of the network in a zone comprising said meter having an influence on a risk of failure of the transmissions of information by said meter, referred to as risk information, said list satisfying a predetermined condition such that at least one of the meters in the list is associated with risk information below a predetermined threshold indicating that a transmission of information emanating from this meter has little chance of colliding with a simultaneous transmission emanating from another meter in the list; transmission means for transmitting a request for information to each meter following insertion thereof in said list; and means for updating the list, executed for each meter in the list, on reception of a response to a request for information concerning said meter or at the expiry of a predefined maximum response time concerning said meter, the list being updated by replacing said meter in the list with another meter in the class so that the updated list satisfies the predetermined condition.

According to a third aspect of the invention, the invention relates to a computer program comprising instructions for the implementation, by a device, of the method according to the first aspect when said program is executed by a processor of said device.

According to a fourth aspect of the invention, the invention relates to storage means storing a computer program comprising instructions for the implementation, by a device, of the method according to the first aspect when said program is executed by a processor of said device.

The features of the invention mentioned above, as well as others, will emerge more clearly from a reading of the following description of an example embodiment, said description being given in relation to the accompanying drawings, among which:

Hereinafter, the invention is described in a context where the PLC communication protocol used in a PLC network in which the invention is implemented is the G3-PLC protocol. The invention can however be implemented in a PLC network in which the PLC communications use the PRIME protocol.

Figure 1:
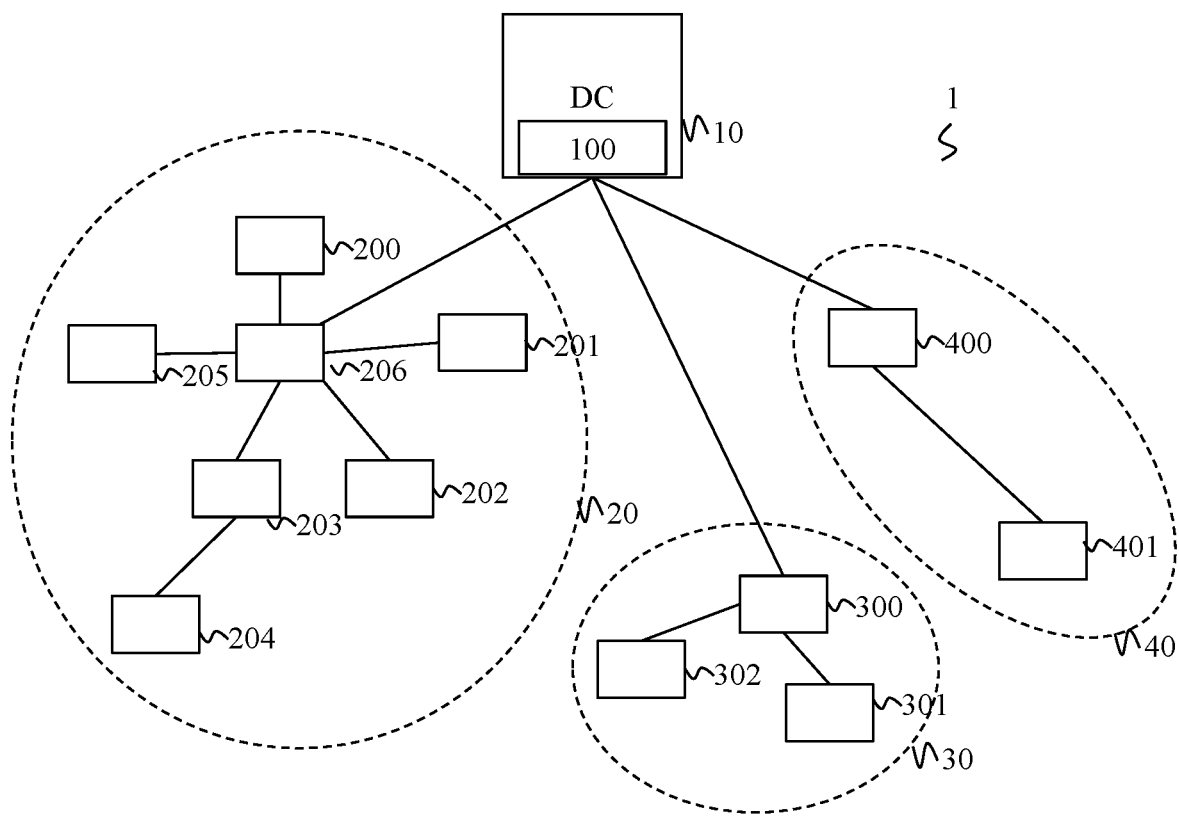
FIG. 1 illustrates schematically an example of an electricity supply network of the AMM type in which the invention is implemented.

FIG. 1 illustrates schematically an example of an electricity supply network of the AMM type (i.e. a PLC network) in which the invention is implemented.

The PLC network 1 comprises a data concentrator 10 to which a set of electricity meters, simply referred to as meters hereinafter, are directly or indirectly connected. The meters are grouped in three groups. A first group 20 comprising meters 200 to 206 comprises a dense zone of the PLC network 1. A dense zone comprises meters having many neighbours in their vicinity, i.e. having a number of neighbours in their vicinity greater than or equal to a first threshold. In one embodiment, a first meter is considered to belong to the vicinity of a second meter if the second meter receives frames from the first meter. A second group 30 comprises meters 300 to 302 and corresponds to a moderately dense zone of the PLC network 1. A moderately dense zone comprises meters having a number of neighbours in their vicinity below the first threshold or greater than or equal to a second threshold. A third group 40 comprises meters 400 and 401 and comprises a sparse zone of the PLC network 1. A sparse zone comprises meters having a number of neighbours in their vicinity below the second threshold.

The data concentrator 10 comprises a processing module 100 implementing the method according to the invention.

The processing module 100 may be integrated natively in the data concentrator 10 or may have been connected to the data concentrator 10, for example to a USB (Universal Serial Bus) port of said data concentrator 10. The processing module 100 may also be a software module.

Figure 2:
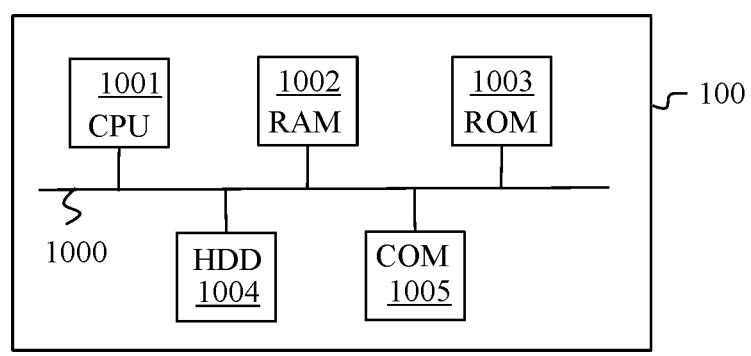
FIG. 2 illustrates schematically an example of hardware architecture of a device implementing the method according to the invention.

FIG. 2 illustrates schematically an example of hardware architecture of the processing module 100 of the data concentrator 10. The processing module 100 then comprises, connected by a communication bus 1000: a processor or CPU (central processing unit) 1001; a random access memory RAM 1002; a read only memory ROM 1003; a storage unit or a storage medium reader, such as an SD (Secure Digital) card reader 1004; a set of communication interfaces 1005 enabling the processing module 100 to communicate with other data concentrator modules 10 or with meters in the PLC network 1.

The processor 1001 is capable of executing instructions loaded in the RAM 1002 from the ROM 1003, from an external memory (not shown), from a storage medium such as an SD card, or from a communication network. When the data concentrator 10 is powered up, the processor 1001 is capable of reading instructions from the RAM 1002 and executing them. These instructions form a computer program causing the implementation, by the processor 1001, of the method described in relation to FIG. 3.

Figure 3:
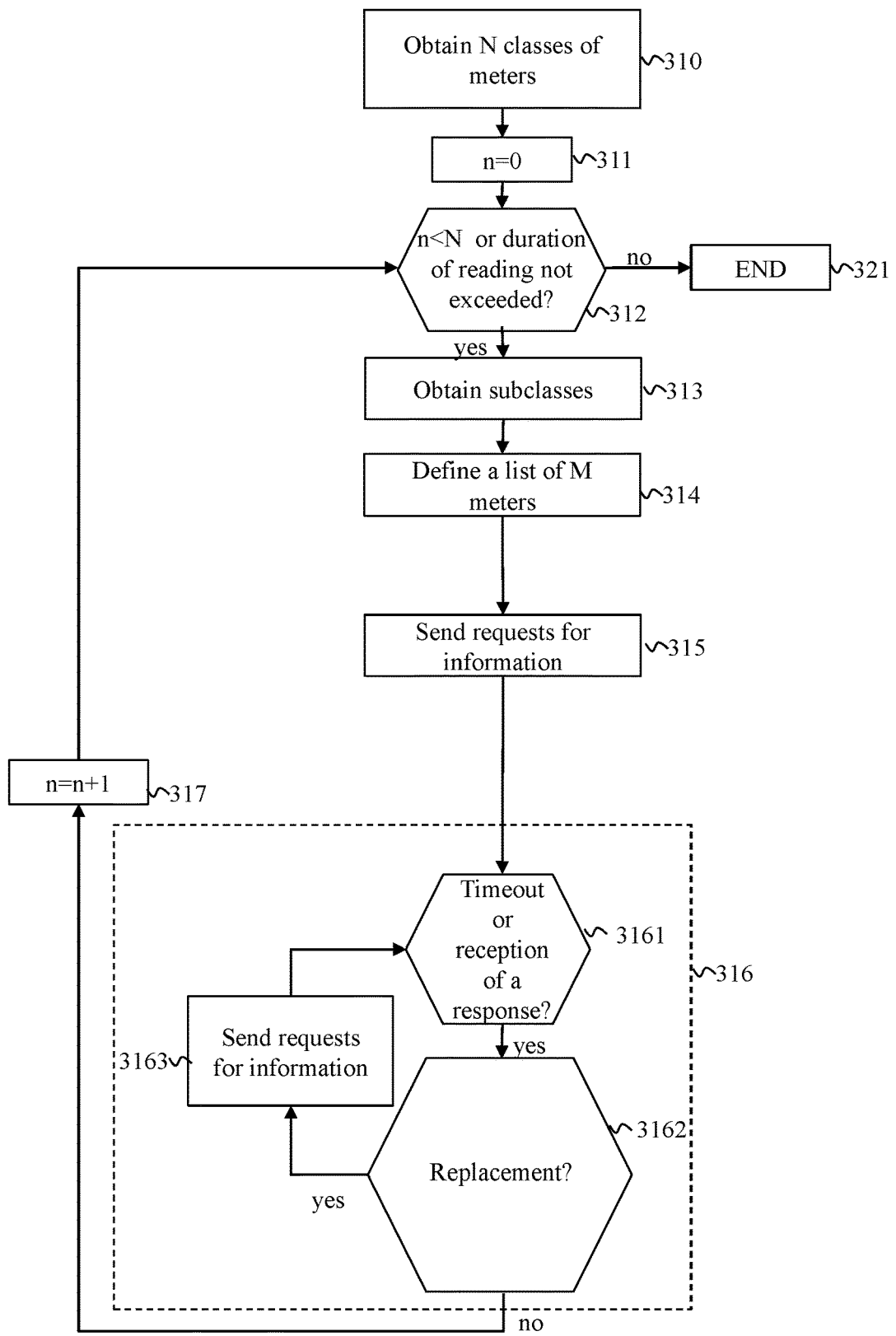
FIG. 3 illustrates schematically a first example of a method for reading information from electricity meters according to the invention.

All or part of the method described in relation to FIG. 3 may be implemented in software form by the execution of a set of instructions by a programmable machine, such as a DSP (digital signal processor) or a microcontroller, or be implemented in hardware form by a machine or a dedicated component, such as an FPGA (field-programmable gate array) or an ASIC (application-specific integrated circuit).

FIG. 3 illustrates schematically a first example of a method for reading information from electricity meters according to the invention.

The method described in relation to FIG. 3 is executed by the data concentrator 10 or more precisely by the processing module 100 of the data concentrator 10, periodically or following a request coming from a user and received by the data concentrator 10. This method is executed during a predefined period, referred to as a reading period, fixing a time allocated to the data concentrator 10 for reading the meters in the PLC network 1. The data concentrator 10 therefore attempts to read information from a maximum number of meters in the PLC network 1 during the reading period. To do this, the data concentrator 10 will use in particular knowledge of a topology of the PLC network 1 in order to reduce the contention times.

In a step 310, the processing module 100 obtains information representing all the meters in the PLC network 1. These meters are classified in a predetermined number N of classes. In one embodiment, N=3. A first class comprises meters in the PLC network 1 for which no information has been collected during the execution of said method preceding a current execution. A second class comprises meters having a rate of response to requests for information transmitted by said data concentrator 10 higher than a predetermined reference rate. A third class comprises meters having a rate of response to the requests for information transmitted by said data concentrator 10 below or equal to said predetermined reference rate. The information representing all the meters in the PLC network 1 obtained in step 310 indicates, for each meter, the class to which this meter belongs.

In one embodiment, the predetermined reference rate is 50%. A meter having a response rate of 50% responds to one request for information out of two.

In a step 311, the processing module 100 initialises a variable n to zero. The variable n is used for running through the classes by increasing order, that is to say from the first to the third.

In a step 312, the processing module 100 checks that the variable n is less than the number of classes N and checks that the time that has elapsed since the start of the implementation of the method in FIG. 3 is less than the reading period. If these two conditions are fulfilled, the processing module 10 passes to steps 313 to 317. Otherwise the processing module 100 ends the method of FIG. 3.

Steps 313 to 317 are executed iteratively for each class. At each iteration, the processing module reads the information from the meters of the $n^{th}$ class. In a first iteration, the processing module 100 therefore reads the information from the meters in the first class. Then, in the following iterations, the processing module 100 increments the variable n by one unit at each iteration in order to pass to the second and then to the third class. The processing module 100 passes from a class currently being read to a new class when there no longer remain any meters to be read in the class currently being read. By proceeding thus, the processing module 100 favours the meters that have not been read during the last implementation of the method in FIG. 3, and then the meters having a good response rate and finally the meters having a poor response rate. In this way, there is no risk of the meters having a poor response rate slowing down the reading of the information from the other meters in the PLC network 1. A meter having a poor response rate to the requests for information coming from the data concentrator 10 is a meter where there is a risk of not responding to the requests for information that are transmitted to it. A meter that does not respond causes latencies at the data concentrator 10 since the latter must await expiry of a maximum waiting time ("timeout") before being able to send a request for information to another meter in the PLC network 1. A meter having a good response rate responds immediately to a request for information and thereby the data concentrator does not have to await the expiry of the maximum waiting time in order to be able to transmit a request for information to another meter in the PLC network 1. This treatment of the meters by class therefore already makes it possible to accelerate the reading of information compared with a random treatment of the meters.

In each class, each electricity meter is classified in at least two subclasses. Each meter is associated with an item of information representing a topology of the PLC network 1 in a zone where the meter having an influence on a risk of failure of the information transmissions by said meter, referred to as risk information, is situated. In one embodiment, a first subclass comprises meters associated with risk information below a first predefined risk threshold. A second subclass comprises meters associated with risk information above a second predefined risk threshold. A third subclass comprises meters associated with risk information lying between the first and second risk thresholds.

In step 313, the processing module 100 obtains, for each meter in the $n^{th}$ class, information representing the subclass to which this meter belongs.

In a step 314, the processing module 100 defines a list of M meters. The list of meters comprises at least one meter in each subclass as long as there remain meters to be read in each subclass. In this way, the processing module 100 reads meters having a high risk of failure conjointly with meters having a moderate risk of failure and meters having a low risk of failure.

In step 315, the processing module 100 sends a request for information to each meter in the list. Each request for information is transmitted in unicast mode in the form of a DLMS/COSEM command (Device Language Message Specification/Companion Specification for Energy Metering: IEC 62056).

In step 316, the processing module 100 awaits responses from each meter to which it has sent a request for information. For each meter, on receiving a response to the request for information concerning said meter or at the expiry of a predefined maximum response time concerning said meter in a step 3161, the processing module 100, in a step 3162, replaces said meter in the list with another meter in the same subclass as long as there remain meters to be read in said subclass. If there are no more meters to be read in the same subclass, the processing module 100 chooses a meter in another subclass in which there remain meters to be read. A request for information is transmitted to each meter (step 3163) by the processing module 100 following the insertion of said meter in said list.

At each passage through step 3162, the processing module checks that the time elapsed since the start of the implementation of the method in FIG. 3 is less than the reading time. If the time elapsed exceeds the reading time, the processing module 100 ends the method in FIG. 3.

When all the meters in the $n^{th}$ class have been read, the processing module 100 passes to step 317, during which it increments the variable n by one unit in order to pass to the following class. The processing module 100 then returns to step 312.

It should be noted that, at each reception of a response or at each expiry of the maximum waiting time (timeout) for a meter, the processing module 100 updates the response rate for this meter.

It will therefore be noted that, throughout the execution of the method of FIG. 3, the processing module 100 ensures that meters in each subclass are read in parallel. Thus, at a given instant, meters of different subclasses respond in parallel to requests for information coming from the data concentrator 10. In this way the risk that these meters may enter contention periods is reduced since there is little chance for data from meters in the first subclass to collide with data from meters in the second or third subclass. The situation would have been different if the processing module 100 had solely read meters in the second subclass at a given instant. This is because meters in the second subclass have a higher risk of having their data transmission fail when they are read simultaneously, but this risk decreases substantially when they are read with meters in other subclasses.

In one embodiment, the information representing a topology of the PLC network 1 in a zone where a meter is situated, referred to as the first meter, influencing a risk of failure of the transmissions of information by said first meter, comprises a value representing a density of meters in the vicinity of said first meter. This is because the denser a zone, in terms of number of meters, where a meter is situated, i.e. the more neighbours there are in the PLC network 1, the higher the risk with this meter that information that it would transmit to the data concentrator 10 would collide with information transmitted by meters in its vicinity if the meters in its vicinity are read at the same moment. On the other hand, an isolated meter will have less risk of having the information that it would transmit coming into collision with information from other meters. In this embodiment, for example, the first risk threshold is a number of neighbours equal to five neighbours and the second risk threshold is a number of neighbours equal to fifteen neighbours. Thus a meter that has a number of neighbours greater than or equal to the second risk threshold belongs to the second subclass. This is the case for example with meters 200 to 206 in FIG. 1. A meter that has a number of neighbours below a first risk threshold belongs to the first subclass. This is the case for example with meters 400 and 401 in FIG. 1. The meters 300 to 302 in FIG. 1 belong to the third subclass.

It should be noted that the data concentrator 10 can at any moment, for each meter, obtain how many neighbours this meter has by using a standard command GetRequest(POSTable) of the DLMS/COSEM protocol.

In this embodiment, the meters can be classified in each subclass by decreasing order of number of neighbours. In this case, when the list is defined or when the list is updated, the meters in each subclass are chosen in their order of appearance in said subclass.

In one embodiment, the information representing a topology of the PLC network 1 in a zone where a meter, referred to as the first meter, is situated, having an influence on a risk of failure of transmissions of information by said first meter, comprises a value representing a number of nodes intermediate between said first meter and said data concentrator 10. Each intermediate node is a meter relaying data from the first meter to the data concentrator 10. This is because the more the data transmitted by a meter must pass through intermediate nodes, the more chances these data have, when they are retransmitted by an intermediate node, of colliding with other data coming from other meters and thus causing periods of contention. In this embodiment, for example, the first risk threshold is a number of intermediate nodes equal to three and the second risk threshold is a number of intermediate nodes equal to eight. Thus a meter the data of which must pass through a number of intermediate nodes above the second risk threshold in order to reach the data concentrator 10 belongs to the second subclass. A meter the data of which must pass through a number of intermediate nodes below the first risk threshold in order to reach the data concentrator 10 belongs to the first subclass. The other meters in the class belong to the third subclass.

It should be noted that the data concentrator 10 can at any time, for each meter, obtain the number of intermediate nodes that the data from said meter must pass through in order to reach the data concentrator 10 by reading an attribute hop_count specified by the G3-PLC protocol in a routing table that the data concentrator 10 stores for said meter.

In this embodiment, the meters can be classified in each subclass by decreasing order of number of intermediate nodes that the data transmitted by these meters must pass through in order to reach the data concentrator 10. In this case, when the list is defined or a meter is replaced in the list, the meters in each subclass are chosen in their order of appearance in said subclass.

In one embodiment, the information representing a topology of the network in a zone where a meter, referred to as the first meter, is situated, having an influence on a risk of failure of the transmissions of information by said first meter, is a combination of a quantity representing a number of nodes intermediate between said first meter and said data concentrator 10 and a quantity representing a density of meters in the vicinity of said first meter. The combination is for example a linear combination or a weighted sum.

In one embodiment, the information representing a topology of the network in a zone where a meter, referred to as the first meter, is situated, having an influence on a risk of failure of transmissions of information by said first meter, is a two-parameter vector comprising a first parameter corresponding to a quantity representing a number of nodes intermediate between said first meter and said data concentrator 10 and a second parameter corresponding to a quantity representing a density of meters in the vicinity of said first meter. Each parameter is then associated with a first risk threshold (low-risk threshold) and a second risk threshold (high-risk threshold) and each class then comprises nine subclasses.

In one embodiment, the number of meters in the list NCL=6 and the processing module 100 chooses two meters in each subclass.

In one embodiment, the list comprises a number of meters for each subclass proportional to a number of meters in the class belonging to said subclass. Thus the more meters a subclass of a class has, the more this subclass is represented in the list.

In one embodiment, the first and second risk thresholds are defined so as to have the same number of meters in each subclass. In this case, when the first list is defined, the processing module 100 chooses the same number of meters in each subclass.

Figure 4:
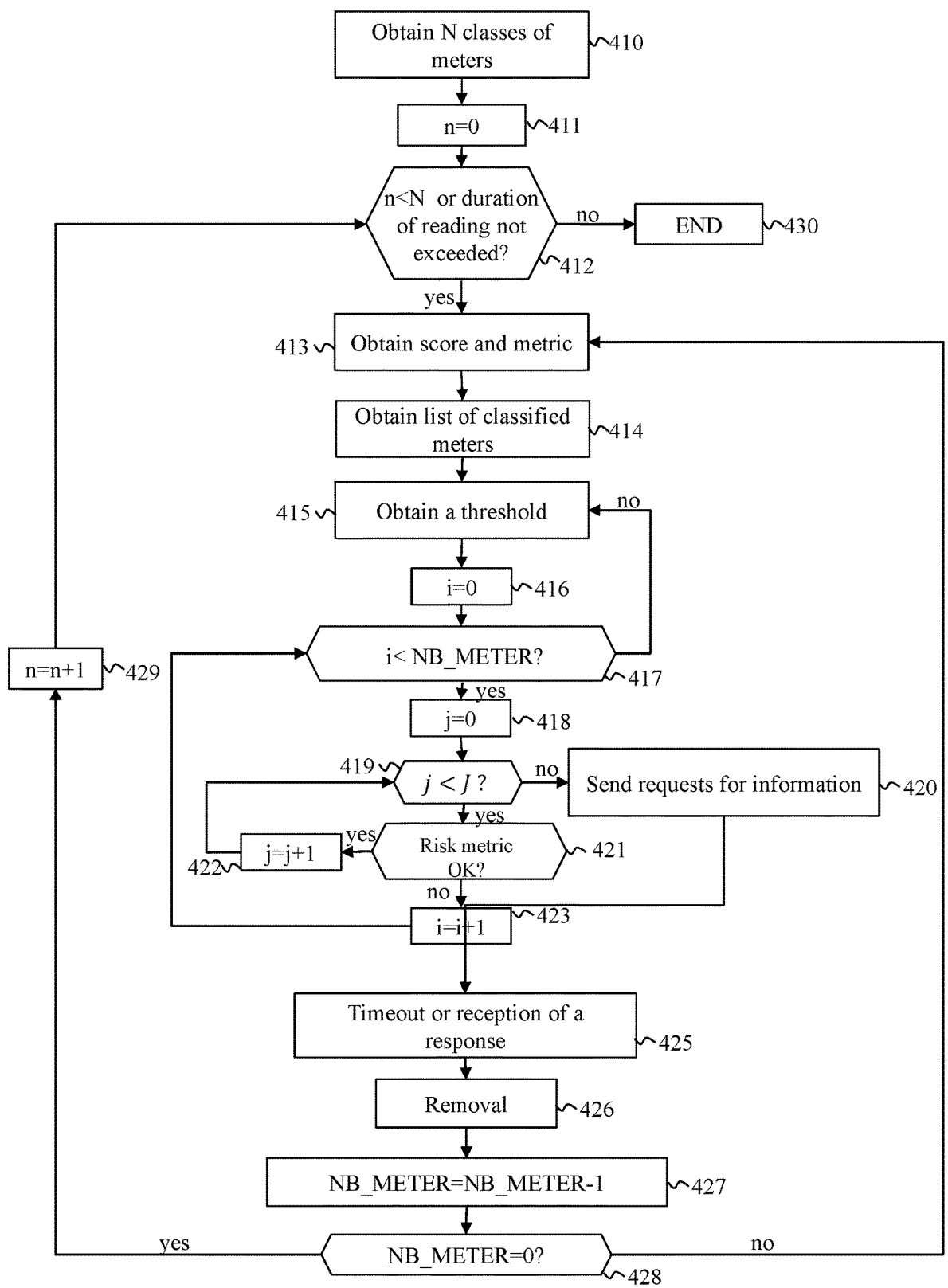
FIG. 4 illustrates schematically a second example of a method for reading information from electricity meters according to the invention.

FIG. 4 illustrates schematically a second example of a method for reading information from electricity meters according to the invention.

The method described in relation to FIG. 4 is also executed by the processing module 100 of the data concentrator 10, periodically or following a request coming from a user received by the data concentrator 10. As in the case of the method described in relation to FIG. 3, the method of FIG. 4 is executed during a reading period. There also the data concentrator 10 will use its knowledge of the topology of the PLC network 1 in order to reduce the contention time.

In a step 410, the processing module 100 obtains information representing all the meters in the PLC network 1. These meters are classified in step 410 in N classes in the same way as in step 310. The information representing all the meters in the PLC network 1 obtained in step 310 therefore indicates, for each meter, the class to which this meter belongs.

In a step 411, the processing module 100 initialises a variable n to zero. The variable n is used for running through the classes by increasing order, that is to say from the first to the third.

In a step 412, the processing module 100 checks that the variable n is less than the number of classes N and checks that the time elapsed since the start of the implementation of the method in FIG. 4 is less than the reading time. If one of these conditions is not fulfilled, the processing module 100 ends the method of FIG. 4 in step 430. Otherwise the processing module passes to a step 413.

In steps 413 to 429, the processing module 100 carries out the processing of a class, referred to as the current class.

In step 413, the processing module 100 calculates, for each pair of meters in the current class, a value, referred to as the risk metric, proportional to a risk of a transmission of information coming from a meter in the pair colliding with a simultaneous transmission of information coming from the other meter in the pair. In one embodiment, the risk metric M of a pair of meters is dependent on a number N of common nodes between the two meters in the pair on a path used by each meter for communicating with the data concentrator 10 and a relative position P of each common node in said path.

$$M = \sum_{i=1}^{i=N} C \times w^P$$

where the parameter C is a predefined cost, referred to as the contention cost, attributed to a pair of meters when, for each meter in the pair, the path leading to the data concentrator 10 has a node in common situated at equal distances from the two meters in the pair, the distance being calculated in number of nodes. The parameter C is positive and for example obtained experimentally. The parameter w is a predefined weighting that attenuates the impact of the predefined cost in the calculation of the risk metric when the node in common on the path used by each meter for communicating with the data concentrator 10 is offset by P nodes. The parameter w is a positive value lying in [0; 1].

The risk value of a pair of meters is therefore proportional to a risk of a transmission of information coming from a meter in the pair coming into collision with a simultaneous transmission of information coming from the other meter in the pair.

In one embodiment C=0.75 and w=0.5.

TABLE 1

| Path 200 | Path 201 | Path 204 | Path 302 |
|----------|----------|----------|----------|
| 206 | 206 | 203 | 300 |
| 10 | 10 | 206 | 10 |
|  |  | 10 |  |

Taking again the example of FIG. 1, the table TAB 1 shows the path used by the meter 200 in the first column on the left (and respectively the meter 201 in the second column, the meter 204 in the third column and the meter 302 in the fourth column) in order to reach the data concentrator 10.

All the paths have at least the node representing the data concentrator 10 in common.

The pair consisting of the meters 200 and 201 has two nodes in common situated at equal positions on the two paths (and therefore P=0). In this case, the risk metric for this pair is calculated at follows:

$$M_{200}^{201} = \sum_{i=1}^{i=N} C \times w^P = 0.75 \times 0.5^0 + 0.75 \times 0.5^0 = 1.5$$

The pair consisting of the meters 200 and 204 has two nodes in common offset by one node (and therefore P=1). In this case, the risk metric for this pair is calculated as follows:

$$M_{200}^{204} = \sum_{i=1}^{i=N} C \times w^P = 0.75 \times 0.5^1 + 0.75 \times 0.5^1 = 0.75$$

The pair consisting of the meters 200 and 302 has one node in common situated at an equal position on the two paths (and therefore P=0). In this case, the risk metric for this pair is calculated as follows:

$$M_{200}^{302} = \sum_{i=1}^{i=N} C \times w^P = 0.75 \times 0.5^0 = 0.75$$

In step 413, the processing module 100 calculates, for each meter in the current class, a value, referred to as the risk score, representing a topology of the network having an influence on the risk of failure of the transmissions of information by said meter. The higher the risk score, the higher the risk of failure of the transmissions of information by said meter.

The risk score $S_c$ of a meter c is a mean of the risk metrics calculated for each pair of meters in which said meter is involved $$S_c = \frac{\sum_{k=1}^{k=K-1} M_c^k}{K-1}$$

where K is the number of meters in the class.

Taking the example of the meter 200 in FIG. 1:

$$S_{200} = (M_{200}^{201} + M_{200}^{202} + M_{200}^{203} + M_{200}^{204} + M_{200}^{205} +$$
$$M_{200}^{206} + M_{200}^{300} + M_{200}^{301} + M_{200}^{302} + M_{200}^{400} + M_{200}^{401} +)/11$$

In a step 414, the processing module 100 classifies the meters in the current class by decreasing order of risk scores. The meters having the most risks of creating a contention in the case of transmission of information in the direction of the data concentrator 10 therefore appear first in the classification obtained.

In a step 415, the processing module 100 allocates an initiation value to a threshold Th, referred to as the risk threshold. The risk threshold Th is used hereinafter to determine whether two meters can be interrogated simultaneously by the data concentrator 10.

In one embodiment, the initialisation value is obtained experimentally.

In one embodiment, the initialisation value is a mean or a median value of the values of risk scores of all the meters in the class.

We shall see hereinafter that the risk threshold Th can be updated by the processing module 100 under certain conditions.

In a step 416, the processing module 100 initialises a variable i to 0. The variable i makes it possible to run through the meters in the current class in the decreasing order of risk scores, that is to say in the order in which the meters have been classified.

Step 416 is followed by steps 417 to 424 for defining a list of a predefined number J of meters by extracting the meters in the class by decreasing order of risk scores. The list is formed under constraint since it must satisfy a predetermined condition such that a risk metric below the risk threshold is associated with each possible pair of meters in the list.

In step 417, the processing module 100 checks whether all the meters in the class have been interrogated by comparing the current value of the variable i with a current number of meters in the current class NB_METER.

If there are still meters to be interrogated in the current class, the processing module 100 performs a step 418, during which it initialises a variable j to 0. j makes it possible to count the number of meters already present in the list.

In a step 419, the processing module 100 checks whether the variable j is smaller than the predefined number of counters J. If such is the case, the processing module 100 passes to a step 421.

In step 421, the processing module 100 checks whether the value of the risk metric of the meter i of the list with each meter already present in the list is lower than the risk threshold Th. If the meter i is the first in the list, it is directly inserted in the list. If the meter i is not the first in the list, if for each pair of meters formed by the meter i and a meter already present in the list the risk metric is below the risk threshold Th, the meter i is inserted in the list. In the last two cases, step 421 is followed by a step 422 during which the variable j is incremented by one unit.

If in step 421 it appears that at least one of the risk metrics considered is higher than J, the processing module 100 increments the variable i by one unit in a step 423 in order to pass to the following meter in the current class and thus to attempt to form a list of J meters with this new meter.

Step 423 is followed by step 417 already explained.

If in step 417 the variable i is equal to the number of meters in the class NB_METER, this means that, with the current risk threshold Th, it was impossible to insert all the meters in the current class in the list of J meters. The risk threshold Th is then considered to be too constraining. Some meters in the current class therefore do not have to be interrogated. In this case, the processing module 100 returns to step 415, during which the risk threshold Th is increased.

In one embodiment, the risk threshold Th is increased by 10% with respect to the previous risk threshold Th in step 415:

$$Th = Th(1+0.1)$$

Next, steps 416 to 423 are implemented again on the meters remaining to be interrogated in the current class.

If in step 419 j=J, i.e. a list of meters has been formed, the processing module 100 sends a request for information to each meter in the list that has not yet been interrogated in a step 420.

Following the sending of a request for information, the processing module 100 awaits reception of a response to this request.

At each reception of a response to a request for information transmitted to a meter in the list or at each expiry of a predefined maximum response time (timeout) concerning a meter in the list, the processing module 100 ends this waiting in a step 425.

In a step 426, the processing module 100 removes the meter to which the response received relates or to which the expiry of the predefined maximum response time relates from the class.

In a step 427, the processing module 100 takes into account the removal of a meter from the class by reducing the number of meters in the current class NB_METER by one unit.

If, after reduction, the number of meters in the current class NB_METER is not zero, the processing module 100 returns to step 413 in order to process the current class after updating thereof in a step 426.

If, after reduction, the number of meters in the current class NB_METER is zero, the processing module 100 considers that all the meters in the current class have been interrogated and that it can pass to the following class. To do this, in a step 429, the processing module 100 increments the variable n by one unit and returns to step 412.

In one embodiment, the processing module 100 could return to step 412 following step 428 so as to check that the reading period is not exceeded more frequently.

The invention claimed is:

1. A method for reading information from a set of electricity meters, referred to as meters, connected by an electricity supply network to a data concentrator, referred to as a concentrator, with which said meters communicate by powerline, wherein the method is executed by said concentrator and comprises:

obtaining information representing a set of meters classified in a plurality of classes, a first class comprising meters for which no up-to-date information is available, and a plurality of second classes containing meters according to a rate of response to requests for information transmitted by said concentrator, the second classes being ordered by decreasing order of response rate;

during a predefined period fixing a time allocated to the concentrator for carrying out the reading of the meters in said set, running through each class one by one by increasing order of classes, passing from a class currently being read to a new class when there no longer remain any meters to be read in the class currently being read; and, in each class:

defining a list of a predefined number of meters in the class, each meter in the list being associated with information representing a topology of the network in a zone comprising said meter having an influence on a risk of failure of the transmissions of information by said meter, referred to as risk information, said list satisfying a predetermined condition such that at least one of the meters in the list is associated with risk information below a predetermined threshold, a request for information being transmitted to each meter following insertion thereof in said list; and, for each meter in the list, on reception of a response to a request for information concerning said meter or at the expiry of a predefined maximum response time concerning said meter, updating the list by replacing said meter in the list with another meter in the class so that the updated list satisfies the predetermined condition.

2. The method according to claim 1, wherein the plurality of second classes comprises a second class comprising meters having a rate of response to requests for information transmitted by said concentrator higher than a predetermined reference level and a third class comprising meters having a rate of response to the requests for information transmitted by said concentrator below or equal to said predetermined reference rate.

3. The method according to claim 2, wherein the risk information is a risk score and, when running through a class, each list is formed by extracting the meters from the class in decreasing order of the risk scores and so as to satisfy a predetermined condition on the list such that a risk metric below a predetermined threshold is associated with each possible pair of meters in the list, said metric being proportional to a risk that a transmission of information emanating from a meter in the pair collides with a simultaneous transmission of information emanating from the other meter in the pair.

4. The method according to claim 3, wherein the risk metric of a pair of meters is dependent on a number of common nodes between the two meters in the pair on a path used by each meter in the pair for communicating with the concentrator and a relative position of each common node in said path.

5. The method according to claim 4, wherein, for each meter in the class, the risk score of said meter is a mean of the risk metric calculated for each pair of meters in which said meter is involved.

6. The method according to claim 5, wherein the predetermined threshold value is a mean of the risk scores.

7. The method according to claim 3, at each updating of the list, the meter to which the response to the request for information or the expiry of a predetermined maximum response time relates is removed from the class and the risk scores are recalculated for the remaining meters in the class, taking into account the removal of said meter from the class.

8. The method according to claim 2, wherein, in each class, the meters are furthermore classified in at least two subclasses, a first subclass comprising meters associated with risk information below a first predetermined risk threshold and a second subclass comprising meters associated with risk information above a second predetermined risk threshold, the list comprising at least one meter in each subclass as long as each subclass comprises at least one meter to be read and wherein, on updating, the list being updated by replacing a meter in the list with another meter in the same subclass as long as there remain meters to be read in said subclass.

9. The method according to claim 8, wherein the risk information associated with a meter, referred to as the first meter, comprises a value representing a density of meters in the vicinity of said first meter and/or a value representing a number of intermediate nodes between said first meter and said concentrator, each intermediate node being a meter relaying frames from the first meter to the concentrator.

10. The method according to claim 8, wherein the list comprises a number of meters for each subclass proportional to a number of meters in the class belonging to said subclass.

11. The method according to claim 8, wherein the first and second risk thresholds are defined so as to have the same number of meters in each subclass and the list comprises the same number of meters in each subclass.

12. The method according to claim 9, wherein the meters are ordered in each subclass by order of values representing a decreasing density of meters and/or by order of values representing a decreasing number of intermediate nodes, and, when the list or each updating of the list is defined, the meters in a subclass are taken in their order of appearance in said subclass.

13. A device for reading information from a set of electricity meters, referred to as meters, connected by an electricity supply network to a data concentrator, referred to as a concentrator, with which said meters communicate by powerline, wherein the device comprises electronic circuitry configured to:

obtain information representing a set of meters classified in a plurality of classes, a first class comprising meters for which no up-to-date information is available, and a plurality of second classes containing meters according to a rate of response to requests for information transmitted by said concentrator, the second classes being ordered by decreasing order of response rate;

run through, for a predefined period fixing a time allocated for making the reading of the meters in said set, each class one by one by increasing order of classes, passing from a class currently being read to a new class when there no longer remain any meters to be read in the class currently being read; and in each class:

define a list of a predefined number of meters in the class, each meter in the list being associated with information representing a topology of the network in a zone comprising said meter having an influence on a risk of failure of the transmissions of information by said meter, referred to as risk information, said list satisfying a predetermined condition such that at least one of the meters in the list is associated with risk information below a predetermined threshold;

transmit a request for information to each meter following insertion thereof in said list; and update the list, executed for each meter in the list, on reception of a response to a request for information concerning said meter or at the expiry of a predefined maximum response time concerning said meter, the list being updated by replacing said meter in the list with another meter in the class so that the updated list satisfies the predetermined condition.

14. The device according to claim 13, wherein the plurality of second classes comprises a second class comprising meters having a rate of response to requests for information transmitted by said concentrator higher than a predetermined reference level and a third class comprising meters having a rate of response to the requests for information transmitted by said concentrator below or equal to said predetermined reference rate.

15. A non-transitory storage medium storing a computer program comprising instructions for the implementation, by a device, of the method according to claim 1 when said program is executed by a processor of said device.

* * * * *